United States Patent
Wang et al.

(10) Patent No.: US 8,736,389 B2
(45) Date of Patent: May 27, 2014

(54) CALIBRATION CIRCUIT OF A FREQUENCY GENERATOR, AND COMPENSATION CIRCUIT THEREOF

(75) Inventors: Yi-Fong Wang, Taoyuan County (TW); Wei-Kung Deng, Taoyuan County (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 49 days.

(21) Appl. No.: 13/234,108

(22) Filed: Sep. 15, 2011

(65) Prior Publication Data
US 2012/0249256 A1    Oct. 4, 2012

(30) Foreign Application Priority Data

Mar. 29, 2011    (TW) .............................. 100110808 A

(51) Int. Cl.
*H03B 5/36*    (2006.01)
(52) U.S. Cl.
USPC ... 331/158; 331/176; 331/116 R; 331/116 FE
(58) Field of Classification Search
USPC .......................... 331/158, 176, 116 R, 116 FE
See application file for complete search history.

(56) References Cited

U.S. PATENT DOCUMENTS

| | | | |
|---|---|---|---|
| 4,079,280 A * | 3/1978 | Kusters et al. | 310/318 |
| 5,481,229 A | 1/1996 | Connell | |
| 6,292,066 B1 | 9/2001 | Shibuya | |
| 7,205,858 B2 * | 4/2007 | Kato | 331/158 |
| 2008/0007363 A1 | 1/2008 | Nagatomo | |

FOREIGN PATENT DOCUMENTS

| | | |
|---|---|---|
| GB | 2 121 629 A | 12/1983 |
| JP | H08116214 | 5/1996 |

* cited by examiner

*Primary Examiner* — Arnold Kinkead
(74) *Attorney, Agent, or Firm* — Winston Hsu; Scott Margo

(57) ABSTRACT

A calibration circuit includes at least two compensation circuits and a comparator. The at least two compensation circuits are coupled to an input signal for outputting at least a first compensation signal and a second compensation signal respectively. The comparator is coupled to the first compensation signal and the second compensation signal for outputting a calibration signal, where the calibration signal is used for determining an oscillation frequency of a crystal oscillator to achieve a purpose of frequency compensation with a temperature.

33 Claims, 9 Drawing Sheets

CALIBRATION CIRCUIT OF A FREQUENCY GENERATOR, AND COMPENSATION CIRCUIT THEREOF

BACKGROUND OF THE INVENTION

1. Field of the Invention

The present invention is related to a calibration circuit and a frequency generator, and particularly to a calibration circuit that can calibrate an oscillation frequency of a crystal oscillator according to a temperature, and a frequency generator that can stably output a frequency not influenced by the temperature.

2. Description of the Prior Art

Quartz is a naturally piezoelectric material. When an external voltage is applied to upper and lower sides of the quartz, the quartz generates mechanical deformation due to a coupling effect between mechanical and electrical characteristics of the quartz, resulting in a voltage drop being generated across the upper and lower sides of the quartz. If an alternating voltage is applied to the upper and lower sides of the quartz, the quartz can generate periodic oscillations. A crystal oscillator composed of quartz has an advantage of high frequency stability, so the crystal oscillator can act as a standard frequency source in various applications, including remote communications, mobile telephone systems, global positioning systems, navigation, remote controls, aerospace industries, high-speed computers, precision measurement instruments, consumer electronics, and other fields for providing accurate frequencies.

Please refer to FIG. 1. FIG. 1 is a diagram illustrating a frequency f generated by the crystal oscillator varying with a temperature. As shown in FIG. 1, the frequency f generated by the crystal oscillator shifts slightly from a target frequency f0 with the temperature, where a vertical axis in FIG. 1 is a ratio of a difference Δf between the frequency f and the target frequency f0 to the target frequency f0. Therefore, the crystal oscillator needs a calibration circuit to compensate for a frequency error of the crystal oscillator that varies with the temperature.

SUMMARY OF THE INVENTION

An embodiment provides a calibration circuit of a frequency generator. The calibration circuit includes at least two compensation circuits and a comparator. The at least two compensation circuits is coupled to an input signal for outputting at least a first compensation signal and a second compensation signal. The comparator is coupled to the first compensation signal and the second compensation signal for outputting a calibration signal, where the calibration signal is used for determining an oscillation frequency of a crystal oscillator of the frequency generator.

Another embodiment provides a frequency generator. The frequency generator includes a crystal oscillator, a temperature detection circuit, and a calibration circuit. The crystal oscillator is used for generating an oscillation frequency. The temperature detection circuit is used for detecting a temperature to generate an input signal. The calibration circuit is coupled to the temperature detection circuit. The calibration circuit includes at least two compensation circuits and a comparator. The at least two compensation circuits is coupled to the input signal for outputting at least a first compensation signal and a second compensation signal. The comparator is coupled to the first compensation signal and the second compensation signal for outputting a calibration signal, where the calibration signal is used for determining the oscillation frequency.

Another embodiment provides a multi-order compensation unit. The multi-order compensation unit includes a first multiplier, a second multiplier, and a first amplifier. The first multiplier is coupled to an input signal and an adjustment parameter signal for outputting a first signal. The second multiplier is coupled to the input signal, the first signal, and the adjustment parameter signal for outputting a second signal. The first amplifier is coupled to the second signal for outputting a compensation signal.

Another embodiment provides a multi-order compensation unit. The multi-order compensation unit includes a first multiplier, a second multiplier, a first amplifier, a third multiplier, and a second amplifier. The first multiplier is coupled to an input signal and a adjustment parameter signal for outputting a first signal. The second multiplier is coupled to the input signal, the first signal, and the adjustment parameter signal for outputting a second signal. The first amplifier is coupled to the second signal for outputting a first compensation signal. The third multiplier is coupled to the input signal, the second signal, and the adjustment parameter signal for outputting a third signal. The second amplifier is coupled to the third signal for outputting a second compensation signal.

Another embodiment provides a multi-order compensation unit. The multi-order compensation unit includes a first multiplier, a second multiplier, a first amplifier, a third multiplier, a second amplifier, a fourth multiplier, and a third amplifier. The first multiplier is coupled to an input signal and a adjustment parameter signal for outputting a first signal. The second multiplier is coupled to the input signal, the first signal, and the adjustment parameter signal for outputting a second signal. The first amplifier is coupled to the second signal for outputting a first compensation signal. The third multiplier is coupled to the input signal, the second signal, and the adjustment parameter signal for outputting a third signal. The second amplifier is coupled to the third signal for outputting a second compensation signal. The fourth multiplier is coupled to the input signal, the third signal, and the adjustment parameter signal for outputting a fourth signal. The third amplifier is coupled to the fourth signal for outputting a third compensation signal.

Another embodiment provides a multi-order compensation unit. The multi-order compensation unit includes a first multiplier, a second multiplier, a first amplifier, a third multiplier, a second amplifier, a fourth multiplier, a third amplifier, a fifth multiplier, and a fourth amplifier. The first multiplier is coupled to an input signal and a adjustment parameter signal for outputting a first signal. The second multiplier is coupled to the input signal, the first signal, and the adjustment parameter signal for outputting a second signal. The first amplifier is coupled to the second signal for outputting a first compensation signal. The third multiplier is coupled to the input signal, the second signal, and the adjustment parameter signal for outputting a third signal. The second amplifier is coupled to the third signal for outputting a second compensation signal. The fourth multiplier is coupled to the input signal, the third signal, and the adjustment parameter signal for outputting a fourth signal. The third amplifier is coupled to the fourth signal for outputting a third compensation signal. The fifth multiplier is coupled to the input signal, the fourth signal, and the adjustment parameter signal for outputting a fifth signal. The fourth amplifier is coupled to the fifth signal for outputting a fourth compensation signal.

The present invention provides a calibration circuit of a frequency generator and a frequency generator. The calibration circuit and the frequency generator utilize at least two compensation circuits to generate at least two compensation signals for compensating a frequency error of a crystal oscillator that varies with a temperature. A plurality of compensation units included by each compensation circuit of the at least two compensation circuits can be combinations of compensation units of any order. But, the at least two compensation circuits do not include a second-order compensation unit. In addition, a third-order compensation unit or a higher than third-order compensation unit of the at least two compensation circuits are realized by a plurality of multipliers and at least one amplifier. Because the plurality of compensation units included by each compensation circuit of the at least two compensation circuits can be combinations of compensation units of any order, the present invention can easily adjust the at least two compensation circuits to reduce design complexity of the at least two compensation circuits and increase compensation accuracy.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
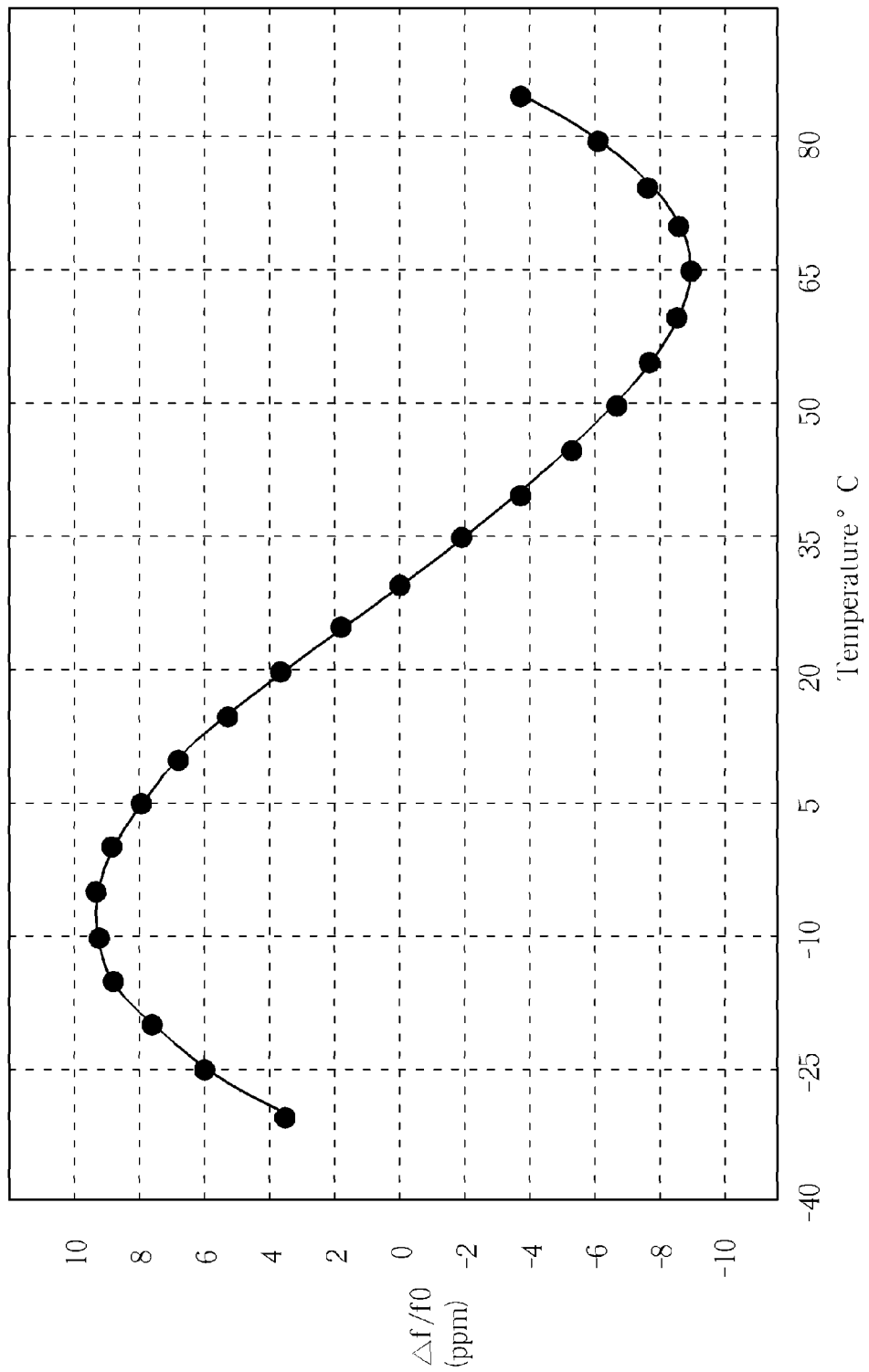
FIG. 1 is a diagram illustrating a frequency generated by the crystal oscillator varying with a temperature.
Figure 2:
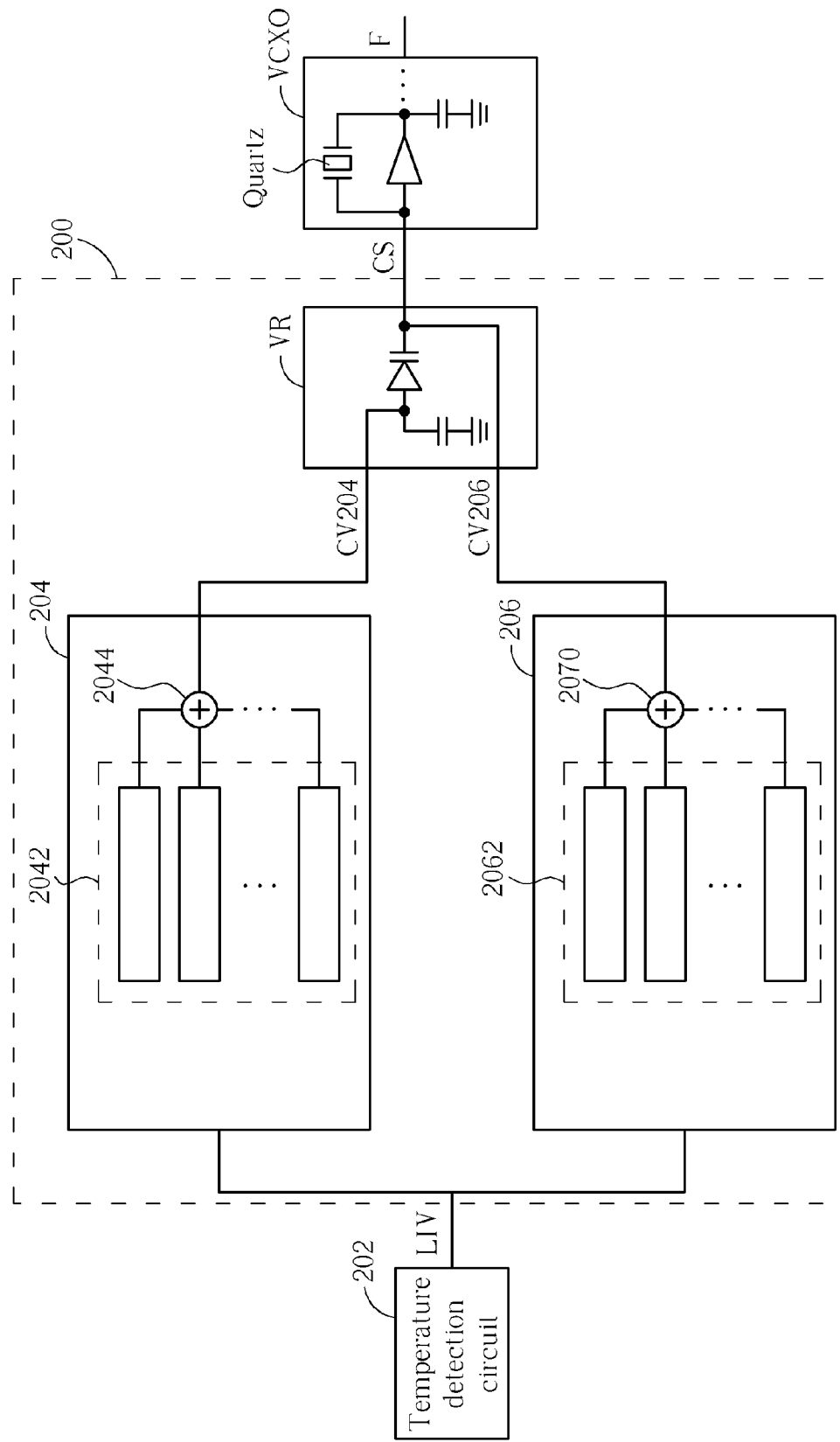
FIG. 2 is a diagram illustrating a calibration circuit of a frequency generator according to an embodiment.

Please refer to FIG. 2. FIG. 2 is a diagram illustrating a calibration circuit 200 of a frequency generator according to an embodiment. The calibration circuit 200 includes two compensation circuits 204, 206 and a comparator VR. The two compensation circuits 204, 206 are used for describing the present invention, and the present invention is not limited to only the two compensation circuits 204, 206. A temperature detection circuit 202 is coupled to the two compensation circuits 204, 206 for detecting a temperature T to generate an input signal LIV, where a linear relationship exists between the input signal LIV and the temperature T. The two compensation circuits 204, 206 are coupled to the input signal LIV, and output a first compensation signal CV204 and a second compensation signal CV206 to the comparator VR, respectively, according to the input signal LIV. The comparator VR is coupled to the first compensation signal CV204 and the second compensation signal CV206, and outputs a calibration signal CS according to the first compensation signal CV204 and the second compensation signal CV206. The calibration signal CS is used for determining an oscillation frequency of a crystal oscillator VCXO, and the crystal oscillator VCXO is a crystal oscillator. The comparator VR is a varactor diode, and the comparator VR can change the calibration signal CS according to the first compensation signal CV204 and the second compensation signal CV206. Therefore, the calibration circuit 200 can fine tune a frequency error of the crystal oscillator VCXO that varies with the temperature according to the calibration signal CS that varies with the temperature. In addition, the calibration circuit 200 can include the temperature detection circuit 202 according to another embodiment.

As shown in FIG. 2, the compensation circuit 204 includes a first compensation unit group 2042 and a first adder 2044. The first compensation unit group 2042 includes n compensation units, and the first compensation unit group 2042 is coupled to the input signal LIV for outputting a first compensation unit signal group, where n≥1. The first adder 2044 is coupled to the first compensation unit signal group for generating the first compensation signal CV204. The compensation circuit 206 includes a second compensation unit group 2062 and a second adder 2070. The second compensation unit group 2062 includes m compensation units for outputting a second compensation unit signal group, where m≥1. The second adder 2070 is coupled to the second compensation unit signal group for generating the second compensation signal CV206. The n compensation units of the first compensation unit group 2042 and the m compensation units of the second compensation unit group 2062 can be combinations of compensation units of any order. But, the first compensation unit group 2042 and the second compensation unit group 2062 do not include a second-order compensation unit.

Figure 3A:
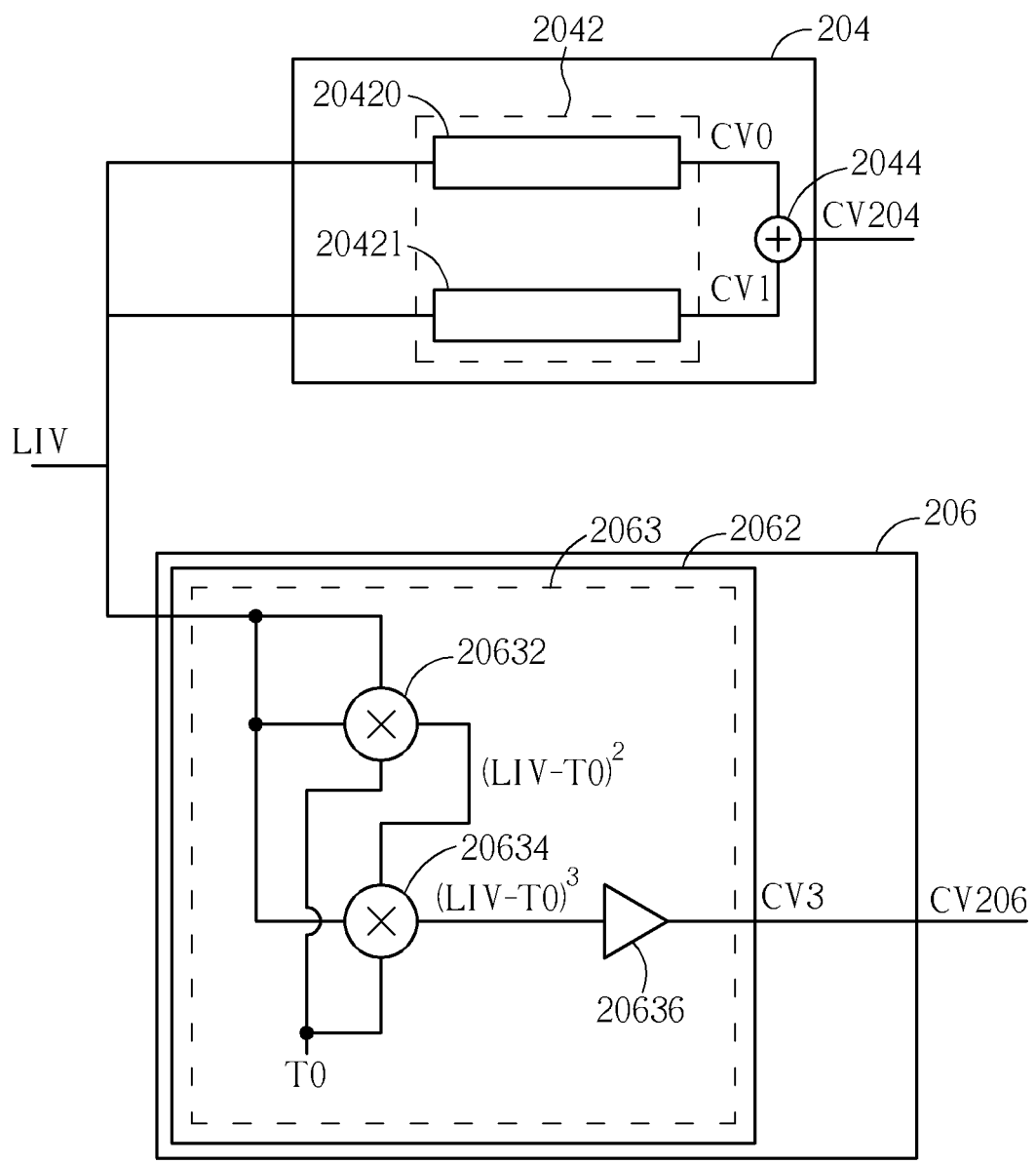
FIG. 3A, FIG. 3B, and FIG. 3C are diagrams illustrating the first compensation unit group and the second compensation unit group according to different embodiments.
Figure 3B:
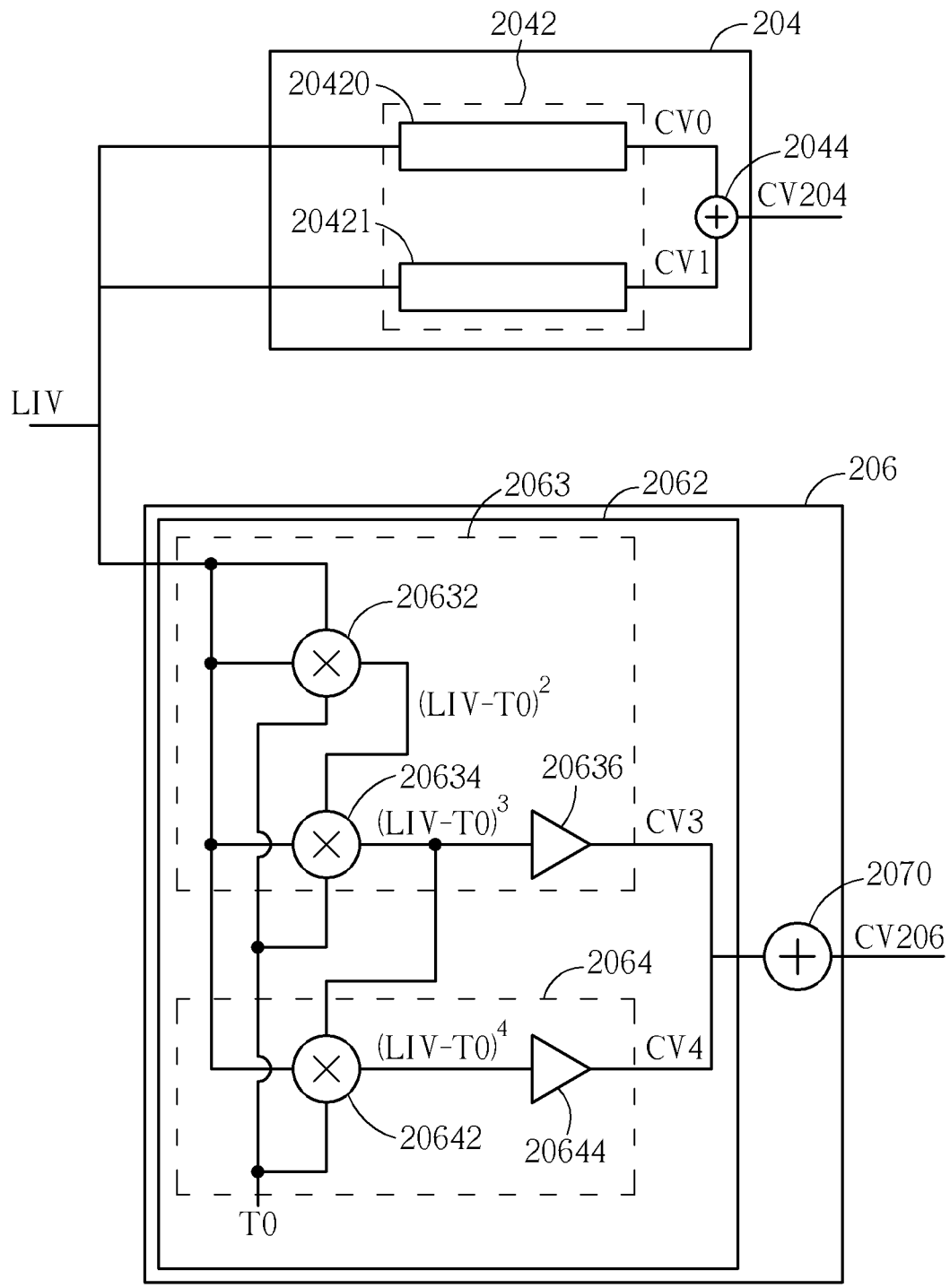
Figure 3C:
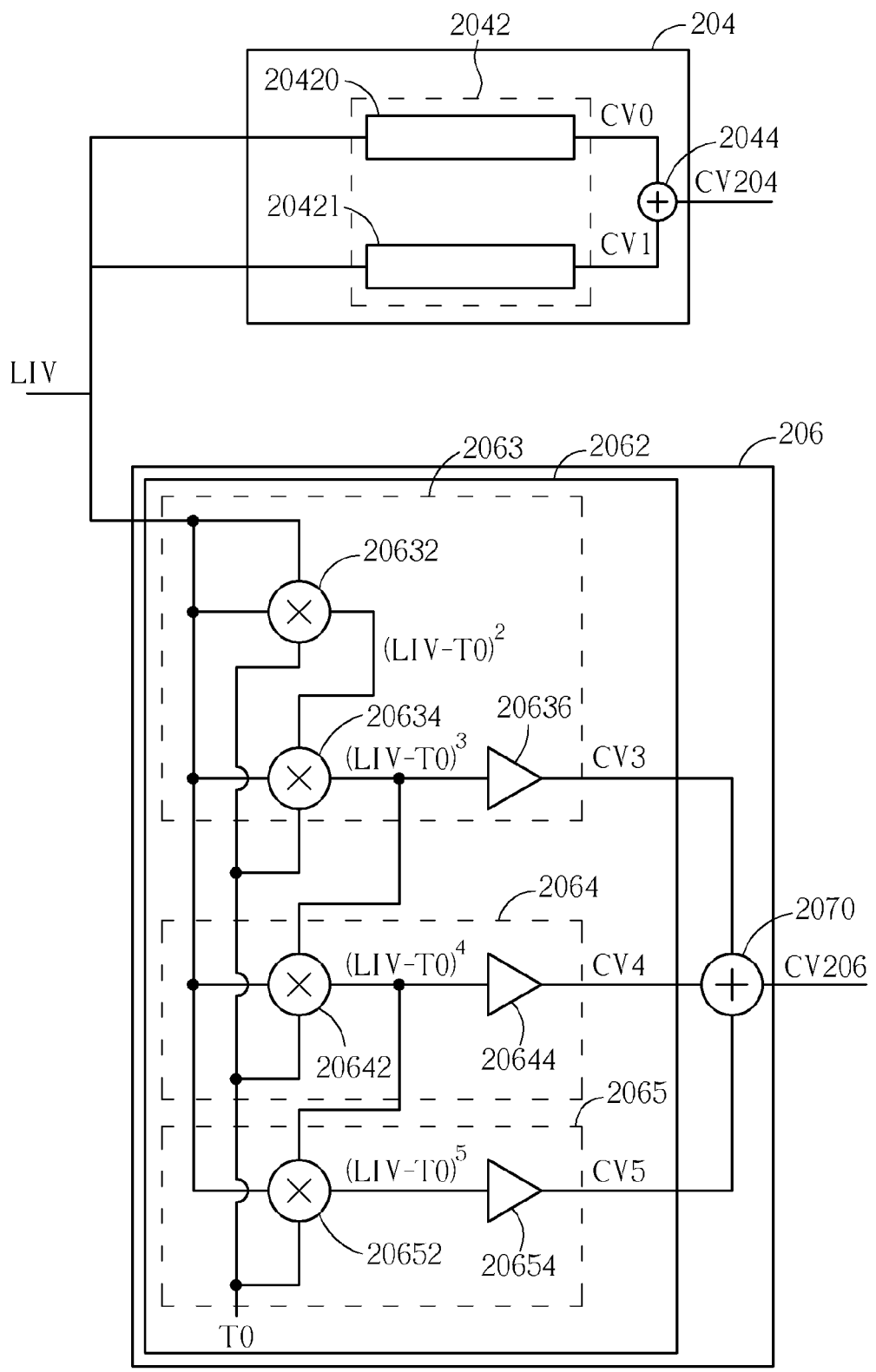

Please refer to FIG. 3A, FIG. 3B, and FIG. 3C. FIG. 3A, FIG. 3B, and FIG. 3C are diagrams illustrating the first compensation unit group 2042 and the second compensation unit group 2062 according to different embodiments. As shown in FIG. 3A, the first compensation unit group 2042 includes a zeroth-order compensation unit 20420, a first-order compensation unit 20421, and a first adder 2044, where the zeroth-order compensation unit 20420 is coupled to the input signal LIV for outputting a zeroth-order compensation signal CV0 according to the input signal LIV. The first-order compensation unit 20421 is coupled to the input signal LIV for outputting a first-order compensation signal CV1 according to the input signal LIV. The first adder 2044 is coupled to the zeroth-order compensation signal CV0 and the first-order compensation signal CV1 for generating the first compensation signal CV204. The second compensation unit group 2062 includes a third-order compensation unit 2063. The third-order compensation unit 2063 includes a first multiplier 20632, a second multiplier 20634, and a first amplifier 20636, where the third-order compensation unit 2063 is coupled to the input signal LIV for outputting a third-order compensation signal CV3 acting as the second compensation signal CV206. The first multiplier 20632 has a first terminal for receiving the input signal LIV, a second terminal for receiving the input signal LIV, a third terminal for receiving an adjustment parameter signal T0, and an output terminal for outputting a first signal $(LIV-T0)^2$. The second multiplier 20634 has a first terminal for receiving the input signal LIV, a second terminal for receiving the first signal $(LIV-T0)^2$, a third terminal for receiving the adjustment parameter signal T0, and an output terminal for outputting a second signal $(LIV-T0)^3$. The first amplifier 20636 has a first terminal coupled to the second multiplier 20634 for receiving the second signal $(LIV-T0)^3$, and an output terminal for outputting a third-order compensation signal CV3. In addition, a higher order compensation signal (a third-order compensation signal or a higher than third-order compensation signal) of the compensation circuit 204 can be generated according to equation (1):

$$CVj = COEF(j-2) \times (LIV-T0)^j \quad (1)$$

As shown in equation (1), a (j−2)th coefficient COEF (j−2) is provided by a (j−2)th amplifier, where j≥3, and j is a positive integer.

Therefore, the third-order compensation signal CV3 can be represented by equation (2):

$$CV3 = COEF1 \times (LIV-T0)^3 \quad (2)$$

Figure 6:
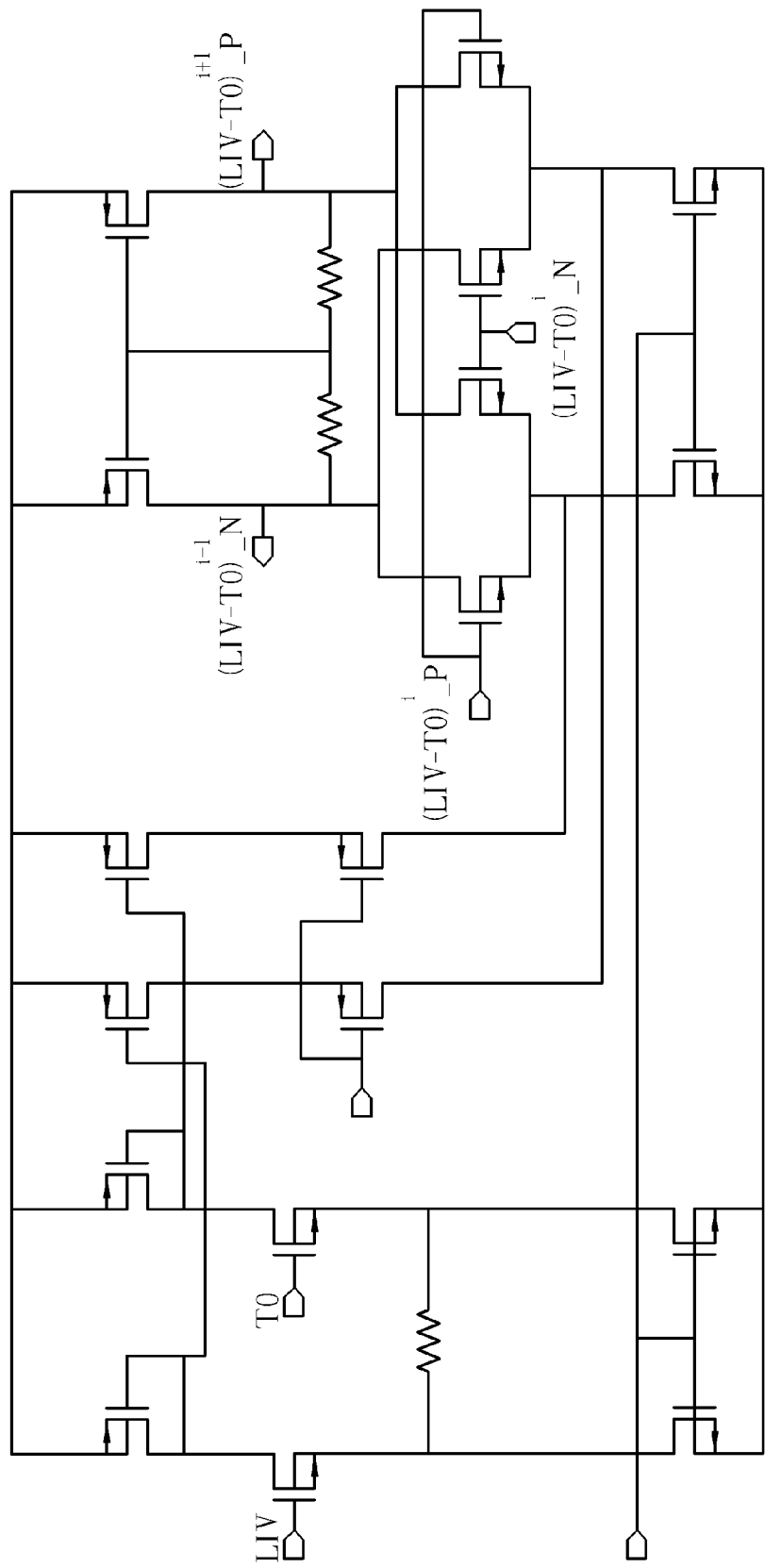
FIG. 6 is a diagram illustrating a Gilbert-cell type multiplier.

As shown in equation (2), a first coefficient COEF1 is provided by the first amplifier 20636, and the first coefficient COEF1 is a constant value. In addition, the first multiplier 20632 and the second multiplier 20634 are Gilbert-cell type multipliers (as shown in FIG. 6). In FIG. 3A, the third-order compensation signal CV3 is the second compensation signal CV206.

As shown in FIG. 3B, the first compensation unit group 2042 includes the zeroth-order compensation unit 20420, the first-order compensation unit 20421, and the first adder 2044. In addition, the first compensation unit group 2042 is described in FIG. 3A, so further descriptions thereof are omitted for simplicity. The second compensation unit group 2062 includes the third-order compensation unit 2063 and a fourth-order compensation unit 2064, where the third-order compensation unit 2063 is described in FIG. 3A, so further descriptions thereof are omitted for simplicity. The fourth-order compensation unit 2064 includes a third multiplier 20642 and a second amplifier 20644. A second adder 2070 is coupled to the third-order compensation signal CV3 and a fourth-order compensation signal CV4 for generating a second compensation signal CV206. The third multiplier 20642 has a first terminal for receiving the input signal LIV, a second terminal for receiving the second signal (LIV−T0)³, a third terminal for receiving the adjustment parameter signal T0, and an output terminal for outputting a third signal (LIV−T0)⁴. The second amplifier 20644 has a first terminal coupled to the third multiplier 20642 for receiving the third signal (LIV−T0)⁴, and an output terminal for outputting the fourth-order compensation signal CV4. The fourth-order compensation signal CV4 is generated according to equation (1), the third signal (LIV−T0)⁴, and a second coefficient COEF2, where the second coefficient COEF2 is a variable coefficient. In addition, the third multiplier 20642 is a Gilbert-cell type multiplier (as shown in FIG. 6). In FIG. 3B, the second compensation signal CV206 is generated by the second adder 2070 according to equation (3), the third-order compensation signal CV3, and the fourth-order compensation signal CV4:

$$CV206 = CV3 + CV4 = COEF1 \times (LIV-T0)^3 + COEF2 \times (LIV-T0)^4 \quad (3)$$

As shown in FIG. 3C, the first compensation unit group 2042 includes the zeroth-order compensation unit 20420, the first-order compensation unit 20421, and the first adder 2044. In addition, the first compensation unit group 2042 is described in FIG. 3A, so further description thereof is omitted for simplicity. The second compensation unit group 2062 includes the third-order compensation unit 2063, the fourth-order compensation unit 2064, a fifth-order compensation unit 2065, and the second adder 2070, where the second adder 2070 is coupled to the third-order compensation signal CV3, the fourth-order compensation signal CV4, and a fifth-order compensation signal CV5 for generating a second compensation signal CV206. The third-order compensation unit 2063 and the fourth-order compensation unit 2064 are described in FIG. 3B, so further description thereof is omitted for simplicity. The fifth-order compensation unit 2065 includes a fourth multiplier 20652 and a third amplifier 20654. The fourth multiplier 20652 has a first terminal for receiving the input signal LIV, a second terminal for receiving the third signal (LIV−T0)⁴, a third terminal for receiving the adjustment parameter signal T0, and an output terminal for outputting a fourth signal (LIV−T0)⁵. The third amplifier 20654 has a first terminal coupled to the fourth multiplier 20652 for receiving the fourth signal (LIV−T0)⁵, and an output terminal for outputting the fifth-order compensation signal CV5. The fifth-order compensation signal CV5 is generated according to equation (1), the fourth signal (LIV−T0)⁵, and a third coefficient COEF3, where the third coefficient COEF3 is a variable coefficient. In addition, the fourth multiplier 20652 is a Gilbert-cell type multiplier (as shown in FIG. 6). In FIG. 3C, the second compensation signal CV206 is generated by the second adder 2070 according to equation (4), the third-order compensation signal CV3, the fourth-order compensation signal CV4, and the fifth-order compensation signal CV5:

$$CV206 = CV3 + CV4 + CV5 \quad (4)$$
$$= COEF1 \times (LIV-T0)^3 + COEF2 \times (LIV-T0)^4 +$$
$$COEF3 \times (LIV-T0)^5$$

Figure 3D:
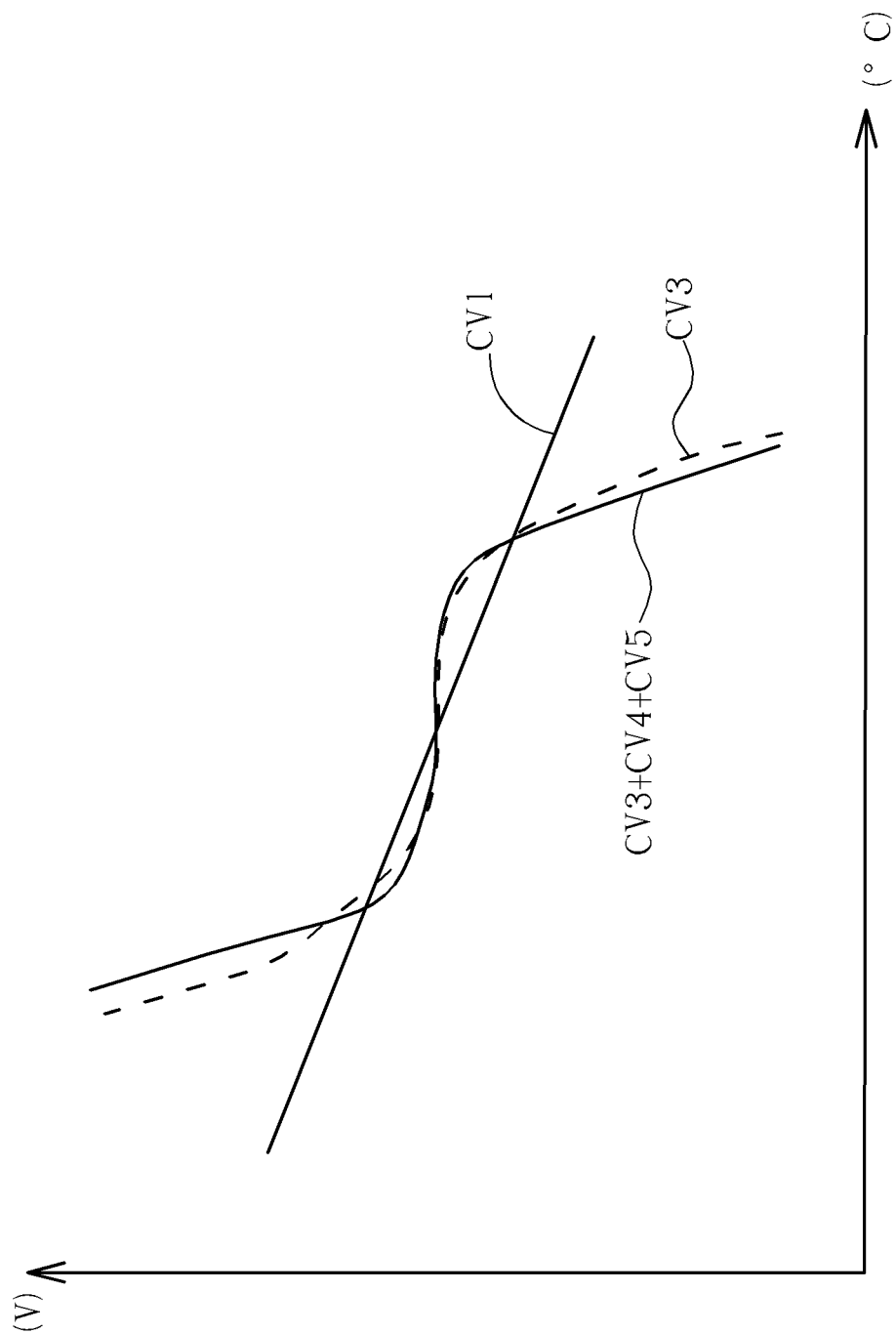
FIG. 3D is a diagram illustrating the second compensation signal, the third-order compensation signal, and the first-order compensation signal in FIG. 3C versus temperature.

Please refer to FIG. 3D. FIG. 3D is a diagram illustrating the second compensation signal CV206 (CV3+CV4+CV5), the third-order compensation signal CV3, and the first-order compensation signal CV1 in FIG. 3C versus the temperature. As shown in FIG. 3D, the second compensation signal CV206, the third-order compensation signal CV3, and the first-order compensation signal CV1 vary with the temperature. Therefore, a user can flexibly adjust a plurality of compensation units included by the two compensation circuits 204, 206 to calibrate the frequency error of the crystal oscillator VCXO to vary exactly with the temperature according to the frequency error of the crystal oscillator VCXO that varies with the temperature.

In another embodiment, the first compensation unit group 2042 includes the zeroth-order compensation unit 20420 and the first-order compensation unit 20421. The second compensation unit group 2062 includes the third-order compensation unit 2063 to a kth-order compensation unit 206k, where k≥6. In addition, subsequent operational principles of the kth-order compensation unit 206k are the same as those of the fourth-order compensation unit 2064 and the fifth-order compensation unit 2065, so further description thereof is omitted for simplicity.

Figure 4:
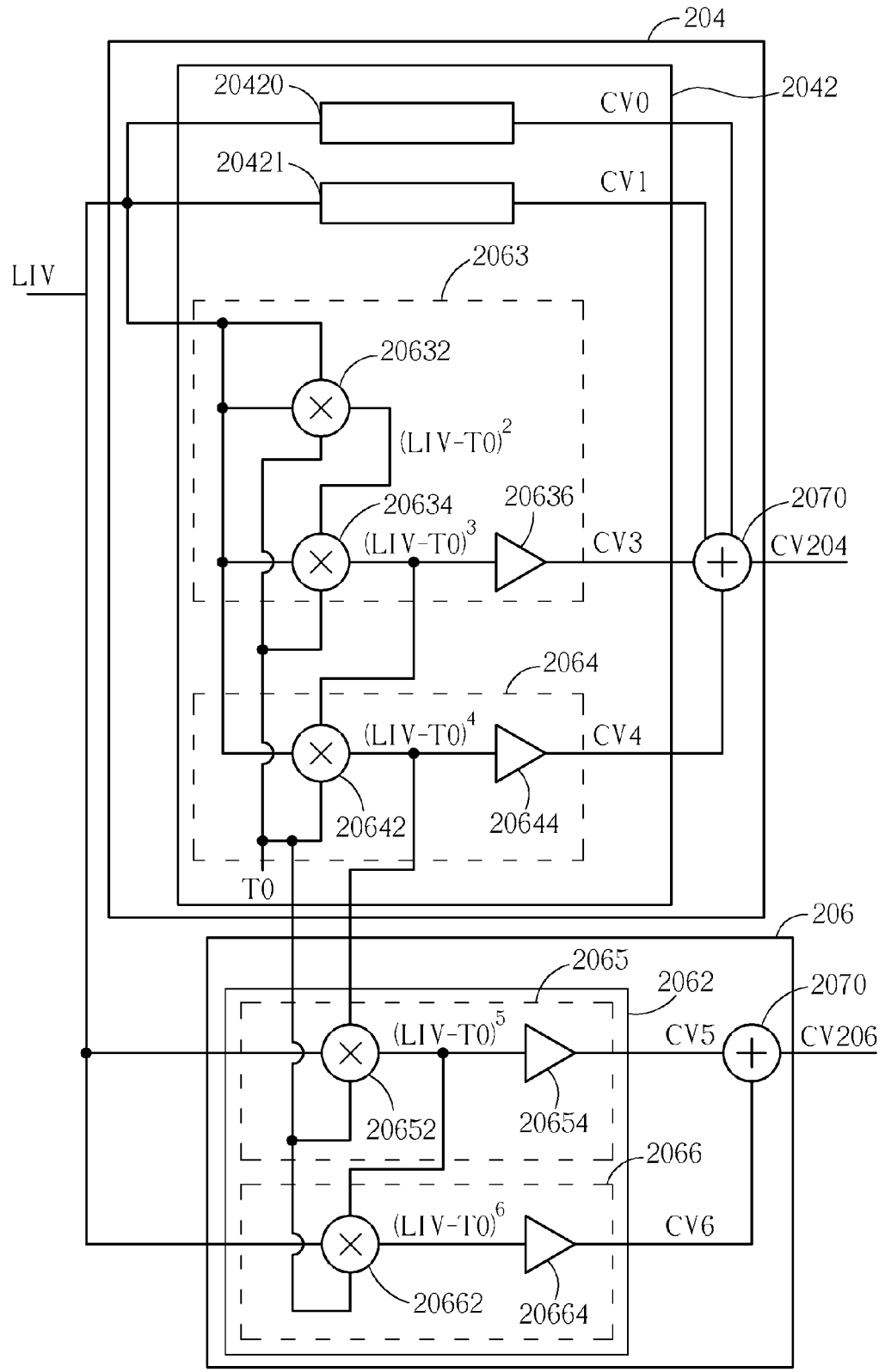
FIG. 4 is a diagram illustrating a first compensation unit group and a second compensation unit group according to another embodiment.

Please refer to FIG. 4. FIG. 4 is a diagram illustrating a first compensation unit group 2042 and a second compensation unit group 2062 according to another embodiment. The first compensation unit group 2042 includes the zeroth-order compensation unit 20420, the first-order compensation unit 20421, the third-order compensation unit 20623, and the fourth-order compensation unit 20624. The second compensation unit group 2042 includes the fifth-order compensation unit 2065 and a sixth-order compensation unit 2066, where the sixth-order compensation unit 2066 includes a fifth multiplier 20662 and a fourth amplifier 20664. Therefore, a first compensation signal CV204 in FIG. 4 is generated by the first adder 2044 according to equation (5), the zeroth-order compensation signal CV0, the first-order compensation signal CV1, the third-order compensation signal CV3, and the fourth-order compensation signal CV4; and, the second compensation signal CV206 is generated by the second adder 2070 according to equation (6), the fifth-order compensation signal CV5, and a sixth-order compensation signal CV6:

$$CV204=CV0+CV1+COEF1\times(LIV-T0)^3+COEF2\times(LIV-T0)^4 \quad (5)$$

$$CV206=COEF3\times(LIV-T0)^5+COEF4\times(LIV-T0)^6 \quad (6)$$

In addition, the embodiments in FIG. 3A, FIG. 3B, FIG. 3C, and FIG. 4 are only used for describing that the first compensation unit group 2042 and the second compensation unit group 2062 can be combinations of compensation units of any order. But, the first compensation unit group 2042 and the second compensation unit group 2062 do not include a second-order compensation unit. Therefore, the present invention is not limited to the embodiments in FIG. 3A, FIG. 3B, FIG. 3C, and FIG. 4.

Figure 5:
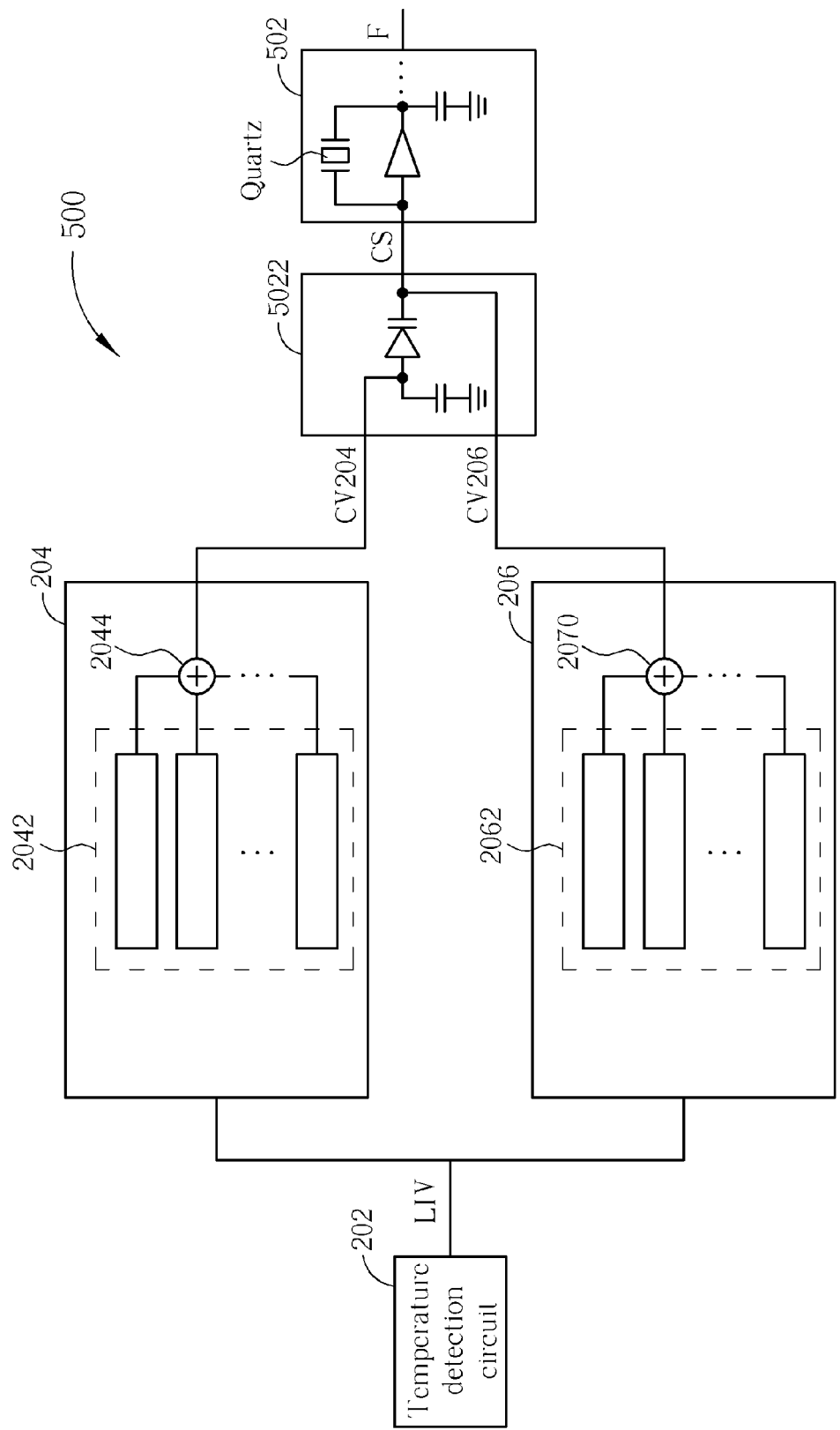
FIG. 5 is a diagram illustrating a frequency generator according to another embodiment.

Please refer to FIG. 5. FIG. 5 is a diagram illustrating a frequency generator 500 according to another embodiment. The frequency generator 500 includes the temperature detection circuit 202, the two compensation circuits 204, 206, and a crystal oscillator 502. The crystal oscillator 502 is used for outputting an oscillation frequency F not influenced by a temperature. Further, subsequent operational principles of the crystal oscillator 502 of the frequency generator 500 are the same as those of the crystal oscillator VCXO in FIG. 2, so further descriptions thereof are omitted for simplicity.

Please refer to FIG. 6. FIG. 6 is a diagram illustrating a Gilbert-cell type multiplier. As shown in FIG. 6, after an ith Gilbert-cell type multiplier receives the adjustment parameter signal T0, the input signal LIV, and an (i−1)th signal (LIV−T0)', the ith Gilbert-cell type multiplier outputs an ith signal $(LIV-T0)^{i-1}$, where the (i−1)th signal $(LIV-T0)^i$ and the ith signal $(LIV-T0)^{i+1}$ are determined by equation (7) and equation (8), respectively:

$$(LIV-T0)^i=(LIV-T0)^i\_P-(LIV-T0)^i\_N \quad (7)$$

$$(LIV-T0)^{i+1}=(LIV-T0)^{i+1}\_P-(LIV-T0)^{i+1}\_N \quad (8)$$

As shown in FIG. 6, equation (7), and equation (8), $(LIV-T0)^i\_P$ and $(LIV-T0)^i\_N$ are differential signals of the (i−1)th signal $(LIV-T0)^i$, and $(LIV-T0)^{i+1}\_P$ and $(LIV-T0)^{i+1}\_N$ are differential signals of the ith signal $(LIV-T0)^{i+1}$.

To sum up, the calibration circuit of the frequency generator and the frequency generator utilize the at least two compensation circuits to generate the at least two compensation signals for compensating the frequency error of the crystal oscillator that varies with the temperature. The plurality of compensation units included by each compensation circuit of the at least two compensation circuits can be combinations of compensation units of any order. But, the at least two compensation circuits do not include the second-order compensation unit. In addition, the third-order compensation unit or the higher than third-order compensation unit of the at least two compensation circuits are realized by a plurality of multipliers and at least one amplifier. Because the plurality of compensation units included by each compensation circuit of the at least two compensation circuits can be combinations of compensation units of any order, the present invention can easily adjust the at least two compensation circuits to reduce design complexity of the at least two compensation circuits and increase compensation accuracy.

Those skilled in the art will readily observe that numerous modifications and alterations of the device and method may be made while retaining the teachings of the invention.

What is claimed is:

1. A calibration circuit of a frequency generator, the calibration circuit comprising:
   at least two compensation circuits coupled to an input signal for outputting at least a first compensation signal and a second compensation signal, respectively, wherein the at least two compensation circuits comprise a first compensation circuit and a second compensation circuit, the first compensation circuit comprising:
      a zeroth-order compensation unit coupled to the input signal for outputting a zeroth-order compensation signal;
      a first-order compensation unit coupled to the input signal for outputting a first-order compensation signal; and
      a first adder coupled to the zeroth-order compensation signal and the first-order compensation signal for generating the first compensation signal; and
   the second compensation circuit comprising:
      an Nth-order compensation unit coupled to the input signal for outputting an Nth-order compensation signal acting as the second compensation signal, wherein N is a positive integer greater than 2; and
   a comparator coupled to the first compensation signal and the second compensation signal for outputting a calibration signal, wherein the calibration signal is used for determining an oscillation frequency of a crystal oscillator of the frequency generator in an open loop.

2. The calibration circuit of claim 1, further comprising a temperature detection circuit for detecting a temperature for generating the input signal.

3. The calibration circuit of claim 1, wherein the Nth-order compensation unit comprises:
   a first multiplier coupled to the input signal and an adjustment parameter signal for outputting a first signal;
   a second multiplier coupled to the input signal, the first signal, and the adjustment parameter signal for outputting a second signal; and
   a first amplifier coupled to the second signal for outputting the Nth-order compensation signal.

4. The calibration circuit of claim 1, wherein the second compensation circuit further comprises:
   an (N+1)th-order compensation unit coupled to the input signal for outputting an (N+1)th-order compensation signal; and
   a second adder coupled to the Nth-order compensation signal and the (N+1)th-order compensation signal for generating the second compensation signal.

5. The calibration circuit of claim 4, wherein the Nth-order compensation unit comprises:
   a first multiplier coupled to the input signal and an adjustment parameter signal for outputting a first signal;
   a second multiplier coupled to the input signal, the first signal, and the adjustment parameter signal for outputting a second signal; and
   a first amplifier coupled to the second signal for outputting the Nth-order compensation signal; and
the (N+1)th-order compensation unit comprises:
   a third multiplier coupled to the input signal, the second signal, and the adjustment parameter signal for outputting a third signal; and
   a second amplifier coupled to the third signal for outputting the (N+1)th-order compensation signal.

6. The calibration circuit of claim 4, wherein the second compensation circuit further comprises:
   an (N+2)th-order compensation unit coupled to the input signal for outputting an (N+2)th-order compensation signal; and
   a second adder coupled to the Nth-order compensation signal, the (N+1)th-order compensation signal, and the (N+2)th-order compensation signal for generating the second compensation signal.

7. The calibration circuit of claim 6, wherein the Nth-order compensation unit comprises:
   a first multiplier coupled to the input signal and an adjustment parameter signal for outputting a first signal;
   a second multiplier coupled to the input signal, the first signal, and the adjustment parameter signal for outputting a second signal; and
   a first amplifier coupled to the second signal for outputting the Nth-order compensation signal;
the (N+1)th-order compensation unit comprises:
   a third multiplier coupled to the input signal, the second signal, and the adjustment parameter signal for outputting a third signal; and
   a second amplifier coupled to the third signal for outputting the (N+1)th-order compensation signal; and
the (N+2)th-order compensation unit comprises:
   a fourth multiplier coupled to the input signal, the third signal, and the adjustment parameter signal for outputting a fourth signal; and
   a third amplifier coupled to the fourth signal for outputting the (N+2)th-order compensation signal.

8. A calibration circuit of a frequency generator, the calibration circuit comprising at least two compensation circuits coupled to an input signal for outputting at least a first compensation signal and a second compensation signal, respectively, wherein the at least two compensation circuits comprise a first compensation circuit and a second compensation circuit, the first compensation circuit comprising:
   a zeroth-order compensation unit coupled to the input signal for outputting a zeroth-order compensation signal;
   a first-order compensation unit coupled to the input signal for outputting a first-order compensation signal;
   an Nth-order compensation unit coupled to the input signal for outputting an Nth-order compensation signal acting as the second compensation signal, wherein N is a positive integer greater than 2;
   an (N+1)th-order compensation unit coupled to the input signal for outputting an (N+1)th-order compensation signal; and
   a first adder coupled to the zeroth-order compensation signal, the first-order compensation signal, the Nth-order compensation signal, and the (N+1)th-order compensation signal for generating the first compensation signal; and
the second compensation circuit comprising:
   an (N+2)th-order compensation unit coupled to the input signal for outputting an (N+2)th-order compensation signal;
   an (N+3)th-order compensation unit coupled to the input signal for outputting an (N+3)th-order compensation signal; and
   a second adder coupled to the (N+2)th-order compensation signal, and the (N+3)th-order compensation signal for generating the second compensation signal; and
a comparator coupled to the first compensation signal and the second compensation signal for outputting a calibration signal, wherein the calibration signal is used for determining an oscillation frequency of a crystal oscillator of the frequency generator in an open loop.

9. The calibration circuit of claim 8, wherein the Nth-order compensation unit comprises:
   a first multiplier coupled to the input signal and an adjustment parameter signal for outputting a first signal;
   a second multiplier coupled to the input signal, the first signal, and the adjustment parameter signal for outputting a second signal; and
   a first amplifier coupled to the second signal for outputting the Nth-order compensation signal.

10. The calibration circuit of claim 8, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal; and
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal.

11. The calibration circuit of claim 8, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal;
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal; and
the (N+2)th-order compensation unit comprises:
    a fourth multiplier coupled to the input signal, the third signal, and the adjustment parameter signal for outputting a fourth signal; and
    a third amplifier coupled to the fourth signal for outputting the (N+2)th-order compensation signal.

12. The calibration circuit of claim 8, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal;
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal;
the (N+2)th-order compensation unit comprises:
    a fourth multiplier coupled to the input signal, the third signal, and the adjustment parameter signal for outputting a fourth signal; and
    a third amplifier coupled to the fourth signal for outputting the (N+2)th-order compensation signal; and
the (N+3)th-order compensation unit comprises:
    a fifth multiplier coupled to the input signal, the fourth signal, and the adjustment parameter signal for outputting a fifth signal; and a fourth amplifier coupled to the fifth signal for outputting the (N+3)th-order compensation signal.

13. The calibration circuit of claim 12, wherein the first multiplier, the second multiplier, the third multiplier, the fourth multiplier, and the fifth multiplier are Gilbert-cell type multipliers.

14. A frequency generator, comprising:
a crystal oscillator for generating an oscillation frequency;
a temperature detection circuit for detecting a temperature to generate an input signal; and
a calibration circuit coupled to the temperature detection circuit, the calibration circuit comprising:
at least two compensation circuits coupled to the input signal for outputting at least a first compensation signal and a second compensation signal, respectively, wherein the at least two compensation circuits comprise a first compensation circuit and a second compensation circuit, the first compensation circuit comprising:
a zeroth-order compensation unit coupled to the input signal for outputting a zeroth-order compensation signal;
a first-order compensation unit coupled to the input signal for outputting a first-order compensation signal; and
first adder coupled to the zeroth-order compensation signal and the first-order compensation signal for generating the first compensation signal; and
the second compensation circuit comprising:
an Nth-order compensation unit coupled to the input signal for outputting an Nth-order compensation signal acting as the second compensation signal, wherein N is a positive integer greater than 2; and
a comparator coupled to the first compensation signal and the second compensation signal for outputting a calibration signal, wherein the calibration signal is used for determining the oscillation frequency in an open loop.

15. The frequency generator of claim 14, wherein the Nth-order compensation unit comprises:
a first multiplier coupled to the input signal and an adjustment parameter signal for outputting a first signal;
a second multiplier coupled to the input signal, the first signal, and the adjustment parameter signal for outputting a second signal; and
a first amplifier coupled to the second signal for outputting the Nth-order compensation signal.

16. The frequency generator of claim 14, wherein the second compensation circuit further comprising:
an (N+1)th-order compensation unit coupled to the input signal for outputting an (N+1)th-order compensation signal; and
a second adder coupled to the Nth-order compensation signal and the (N+1)th-order compensation signal for generating the second compensation signal.

17. The frequency generator of claim 16, wherein the Nth-order compensation unit comprises:
a first multiplier coupled to the input signal and an adjustment parameter signal for outputting a first signal;
a second multiplier coupled to the input signal, the first signal, and the adjustment parameter signal for outputting a second signal; and
a first amplifier coupled to the second signal for outputting the Nth-order compensation signal; and
the (N+1)th-order compensation unit comprises:
a third multiplier coupled to the input signal, the second signal, and the adjustment parameter signal for outputting a third signal; and a second amplifier coupled to the third signal for outputting the (N+1)th-order compensation signal.

18. The frequency generator of claim 14, wherein the second compensation circuit further comprises:
an (N+1)th-order compensation unit coupled to the input signal for outputting an (N+1)th-order compensation signal;
an (N+2)th-order compensation unit coupled to the input signal for outputting an (N+2)th-order compensation signal; and
a second adder coupled to the Nth-order compensation signal, the (N+1)th-order compensation signal, and the (N+2)th-order compensation signal for generating the second compensation signal.

19. The frequency generator of claim 18, wherein the Nth-order compensation unit comprises:
a first multiplier coupled to the input signal and an adjustment parameter signal for outputting a first signal;
a second multiplier coupled to the input signal, the first signal, and the adjustment parameter signal for outputting a second signal; and
a first amplifier coupled to the second signal for outputting the Nth-order compensation signal;
the (N+1)th-order compensation unit comprises:
a third multiplier coupled to the input signal, the second signal, and the adjustment parameter signal for outputting a third signal; and
a second amplifier coupled to the third signal for outputting the (N+1)th-order compensation signal; and
the (N+2)th-order compensation unit comprises:
a fourth multiplier coupled to the input signal, the third signal, and the adjustment parameter signal for outputting a fourth signal; and
a third amplifier coupled to the fourth signal for outputting the (N+2)th-order compensation signal.

20. A frequency generator, comprising:
a crystal oscillator for generating an oscillation frequency;
a temperature detection circuit for detecting a temperature to generate an input signal; and
a calibration circuit coupled to the temperature detection circuit, the calibration circuit comprising:
at least two compensation circuits coupled to the input signal for outputting at least a first compensation signal and a second compensation signal, respectively, wherein the at least two compensation circuits comprise a first compensation circuit and a second compensation circuit, the first compensation circuit comprising:
a zeroth-order compensation unit coupled to the input signal for outputting a zeroth-order compensation signal;
a first-order compensation unit coupled to the input signal for outputting a first-order compensation signal;
an Nth-order compensation unit coupled to the input signal for outputting an Nth-order compensation signal acting as the second compensation signal, wherein N is a positive integer greater than 2;
an (N+1)th-order compensation unit coupled to the input signal for outputting an (N+1)th-order compensation signal; and
a first adder coupled to the zeroth-order compensation signal, the first-order compensation signal, the Nth-order compensation signal, and the (N+1)th-order compensation signal for generating the first compensation signal; and the second compensation circuit comprising:
    an (N+2)th-order compensation unit coupled to the input signal for outputting an (N+2)th-order compensation signal;
    an (N+3)th-order compensation unit coupled to the input signal for outputting an (N+3)th-order compensation signal; and
    a second adder coupled to the (N+2)th-order compensation signal, and the (N+3)th-order compensation signal for generating the second compensation signal.

21. The frequency generator of claim 20, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal.

22. The frequency generator of claim 20, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal; and
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal.

23. The frequency generator of claim 20, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal;
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal; and
the (N+2)th-order compensation unit comprises:
    a fourth multiplier coupled to the input signal, the third signal, and the adjustment parameter signal for outputting a fourth signal; and
    a third amplifier coupled to the fourth signal for outputting the (N+2)th-order compensation signal.

24. The frequency generator of claim 20, wherein the Nth-order compensation unit comprises:
    a first multiplier coupled to the input signal and an adjustment parameter signal for outputting a first signal;
    a second multiplier coupled to the input signal, the first signal, and the adjustment parameter signal for outputting a second signal; and
    a first amplifier coupled to the second signal for outputting the Nth-order compensation signal;
the (N+1)th-order compensation unit comprises:
    a third multiplier coupled to the input signal, the second signal, and the adjustment parameter signal for outputting a third signal; and
    a second amplifier coupled to the third signal for outputting the (N+1)th-order compensation signal;
the (N+2)th-order compensation unit comprises:
    a fourth multiplier coupled to the input signal, the third signal, and the adjustment parameter signal for outputting a fourth signal; and
    a third amplifier coupled to the fourth signal for outputting the (N+2)th-order compensation signal; and
the (N+3)th-order compensation unit comprises:
    a fifth multiplier coupled to the input signal, the fourth signal, and the adjustment parameter signal for outputting a fifth signal; and
    a fourth amplifier coupled to the fifth signal for outputting the (N+3)th-order compensation signal.

25. The frequency generator of claim 24, wherein the first multiplier, the second multiplier, the third multiplier, the fourth multiplier, and the fifth multiplier are Gilbert cell type multipliers.

26. A calibration circuit of a frequency generator, the calibration circuit comprising:
    at least two compensation circuits coupled to an input signal for outputting at least a first compensation signal and a second compensation signal, respectively, wherein the at least two compensation circuits comprise a first compensation circuit and a second compensation circuit, the first compensation circuit comprising:
        a first compensation unit group coupled to the input signal for outputting a first compensation unit signal group; and
        a first adder coupled to the first compensation unit signal group for generating the first compensation signal; and
    the second compensation circuit comprising:
        a second compensation unit group coupled to the input signal for outputting a second compensation unit signal group; and
        a second adder coupled to the second compensation unit signal group for generating the second compensation signal; and
    a comparator coupled to the first compensation signal and the second compensation signal for outputting a calibration signal, wherein the calibration signal is used for determining an oscillation frequency of a crystal oscillator of the frequency generator.

27. A frequency generator, comprising:
a crystal oscillator for generating an oscillation frequency;
a temperature detection circuit for detecting a temperature to generate an input signal; and
a calibration circuit coupled to the temperature detection circuit, the calibration circuit comprising:
    at least two compensation circuits coupled to the input signal for outputting at least a first compensation signal and a second compensation signal, respectively, wherein the at least two compensation circuits comprise a first compensation circuit and a second compensation circuit, the first compensation circuit comprising:
        a first compensation unit group coupled to the input signal for outputting a first compensation unit signal group; and
        a first adder coupled to the first compensation unit signal group for generating the first compensation signal; and the second compensation circuit comprising:
- a second compensation unit group coupled to the input signal for outputting a second compensation unit signal group; and
- a second adder coupled to the second compensation unit signal group for generating the second compensation signal; and a comparator coupled to the first compensation signal and the second compensation signal for outputting a calibration signal, wherein the calibration signal is used for determining the oscillation frequency in an open loop.

28. The calibration circuit of claim 1, wherein the comparator is a varactor diode.

29. The calibration circuit of claim 8, wherein the comparator is a varactor diode.

30. The frequency generator of claim 14, wherein the comparator is a varactor diode.

31. The frequency generator of claim 20, wherein a varactor diode comparator is coupled to the first compensation signal and second compensation signal.

32. The frequency generator of claim 26, wherein the comparator is a varactor diode.

33. The frequency generator of claim 27, wherein the comparator is a varactor diode.

* * * * *